United States Patent
Abdallah et al.

(10) Patent No.: US 6,282,554 B1
(45) Date of Patent: *Aug. 28, 2001

(54) METHOD AND APPARATUS FOR FLOATING POINT OPERATIONS AND FORMAT CONVERSION OPERATIONS

(75) Inventors: Mohammad A. Abdallah, Folsom; Prasad Modali, El Dorado Hills, both of CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 5 days.

(21) Appl. No.: 09/071,466

(22) Filed: Apr. 30, 1998

(51) Int. Cl.[7] .................................. G06F 7/00; G06F 7/38
(52) U.S. Cl. ............................................. 708/204; 708/495
(58) Field of Search ................................... 708/402, 495, 708/496, 497, 498, 501, 505

(56) References Cited

U.S. PATENT DOCUMENTS

| | | | |
|---|---|---|---|
| 4,949,291 | 8/1990 | Saini | 364/715.03 |
| 5,157,388 | 10/1992 | Kohn | 340/800 |
| 5,257,215 | * 10/1993 | Poon | 708/204 |
| 5,303,174 | * 4/1994 | Okamoto | 708/505 |
| 5,404,469 | 4/1995 | Chung et al. . | |
| 5,528,741 | 6/1996 | Lucas . | |
| 5,627,773 | * 5/1997 | Wolrich et al. | 708/204 |
| 5,673,407 | 9/1997 | Poland et al. . | |
| 5,696,709 | 12/1997 | Smith, Sr. . | |
| 5,721,855 | 2/1998 | Hinton et al. . | |
| 5,729,724 | 3/1998 | Sharangpani et al. . | |
| 5,740,093 | 4/1998 | Sharangpani . | |
| 5,761,103 | 6/1998 | Oakland et al. . | |
| 5,764,548 | 6/1998 | Keith et al. . | |
| 5,768,170 | 6/1998 | Smith . | |
| 5,802,219 | 9/1998 | Farkas et al. . | |
| 5,805,486 | 9/1998 | Sharangpani . | |
| 5,848,284 | 12/1998 | Sharangpani . | |
| 5,852,726 | 12/1998 | Lin et al. . | |
| 5,874,969 | 2/1999 | Storm et al. . | |
| 5,933,160 | 8/1999 | Kabir et al. . | |
| 5,968,116 | 10/1999 | Day, II et al. . | |
| 5,978,901 | 11/1999 | Luedtke et al. . | |
| 6,058,465 | 5/2000 | Nguyen . | |
| 6,061,782 | 5/2000 | Elliot et al. . | |

OTHER PUBLICATIONS

Sun Microsystems; "Visual Instruction Set (VIS™) User's Guide"; Ver. 1.1, Mar. 1997; pp. 11–12.
Advanced Micro Devices (AMD); "AMD–3D™ Technology Manual"; Feb., 1998; pp. 19, 20.
MIPS Technologies, Inc.; "MIPS Extension for Digital Media with 3D"; Dec. 3, 1996, pp. 1–26.
Bistry, et al.; "The Complete Guide to MMX™ Technology"; 1997; Chapter 1—pp. 2–22.
Bistry, et al.; "The Complete Guide to MMX™ Technology"; 1997; Chapter 2—pp. 24–34.
Bistry, et al.; "The Complete Guide to MMX™ Technology"; 1997; Chapter 4—pp. 54–65.

(List continued on next page.)

Primary Examiner—Chuong Dinh Ngo
(74) Attorney, Agent, or Firm—Larry Mennemeier

(57) ABSTRACT

A floating point arithmetic apparatus for converting numbers between an integer format and a floating point format, wherein a conversion operation requires a greater data path width than a conversion operation. The apparatus comprises right shift circuitry that receives a number in the floating point format, wherein the right shift circuitry includes additional register positions to accommodate a shift beyond a data path width required by an arithmetic operation.

16 Claims, 6 Drawing Sheets

OTHER PUBLICATIONS

Bistry, et al.; "The Complete Guide to MMX™ Technology"; 1997; Chapter 5—pp. 68–110.

Bistry, et al.; "The Complete Guide to MMX™ Technology"; 1997; Appendix B—pp. 257–268.

Tom Shanley; "Pentium® Pro and Pentium®II System Architecture"; 1998; Chapter 18—pp. 379–406.

Tom Shanley; "Pentium® Pro and Pentium ®II System Architecture"; 1998; Chapter 26—pp. 507–520.

Rohan Coelho, et al.; "Direct X®, RDX, RSX, and MMX™ Technology a Jumpstart Guide to High Performance APIs"; 1998; Chapter 18—pp. 277–286.

Rohan Coelho, et al.; "Direct X®, RDX, RSX, and MMX™ Technology a Jumpstart Guide to High Performance APIs"; 1998, Chapter 19—pp. 289–308.

Rohan Coelho, et al.; "Direct X®, RDX, RSX, and MMX™ Technology a Jumpstart Guide to High Performance APIs"; 1998; Chapter 20—pp. 311–330.

Rohan Coelho, et al.; "Direct X®, RDX, RSX, and MMX™ Technology a Jumpstart Guide to High Performance APIs"; 1998; Chapter 22—pp. 349–371.

Alpha Architecture Handbook Version 3, Oct. 1996, pp. 4–79 to 4–116.

"Mechanism to clamp and pack lit floating–point colors", IBM Technical Disclosure Bulletin, Mar. 1997, v40, n3, pp 163–164.

"Hyperspeed product benchmarks—X860/XP860", Apr. 3, 1996, at www5.electriciti.com/hyperspd/i860bnch.html.

AMD–K6 Processor Data Sheet, Mar. 1998, Advanced Micro Devices, Inc. pp. 21–38.

"MIPS V Instruction Set," Oct. 1996, Rev. 1.0; pp. B–1, B–2, B–18.

"MIPS Digital Media Extension"; Oct. 1996, Rev. 1.0 pp C–1, C–2.

Darley, M. et al, "The TMS390C602A Floating–Point Coprocessor for Sparc Systems", IEEE MICRO, Jun. 1990, pp. 36–47.

Gilliam, K. et al, "Design and Architecture for a Multi--Mode Pipelined, Floating–Point Adder", Proceedings of the IEEE, 1991, pp. 73–76.

\* cited by examiner

FLOATING POINT

106 — $1.100 \times 2^2$
110 — $1 + 1^{-1} \times 2^2$
112 — $1.5 \times 4 = 6_{10}$

INTEGER

108 — $110.0_2$
114 — $2^2 + 2^1 + 2^0 = 6_{10}$
116 — $4 + 2 + 0 = 6_{10}$

METHOD AND APPARATUS FOR FLOATING POINT OPERATIONS AND FORMAT CONVERSION OPERATIONS

FIELD OF THE INVENTION

The present invention is in the field of computer operations on numbers in binary formats, including conversions between formats.

BACKGROUND OF THE INVENTION

In some computer applications, the required range of numbers is very large. While it is possible to represent such numbers as multibyte integers or multibyte fractions, the memory required for storage is excessive. Also, when the number of significant bits required is small, the use of a multibyte representation is wasteful of memory. In addition, most very large or very small numbers do not require the precision of a multibyte representation. A more efficient representation of very large or very small decimal numbers is floating point notation or format. In digital systems, floating point format is the counterpart of scientific notation. Floating point is useful for performing operations that require many precise calculations, such as operations in a graphics application.

FIG. 1 shows base 2 representations of the number 6 in both floating point and integer formats. Number 106 is a base 2 floating point representation of the number 6. Number 108 is an integer base 2 representation of the number 6. Numbers in floating point format are always aligned on the left, that is, they are always normalized so that only one, non-zero number appears to the left of the decimal point as in number 106. Integer representations, on the other hand, are aligned on the right, that is, the decimal point appears as far to the right as possible to represent the number without multiplication by a number represented by the base raised to a power. Steps 110 and 112 show how floating point number 106 is converted to the base 10 integer "6". Steps 114 and 116 show how integer 108 is converted to the base 10 integer "6".

Processors that perform floating point operations typically include special floating point circuitry to perform operations such as addition, subtraction, etc. Because it is not necessary or efficient for floating point numbers to be used for every application that may be executed on a processor, processors have the capability of performing operations using either floating point numbers or integer numbers. Conversions between the two formats are therefore often required. As seen by a comparison of number 106 with number 108, conversion between floating point and integer formats involves shifting the decimal point to the right or left. Floating point arithmetic units in typical processors include shift circuits. For example, a multiplication operation is equal to a shift of one bit position for every multiplication by 2. Preferably, existing floating point arithmetic circuitry could be used for both performing floating point arithmetic operations and converting operands between floating point and integer formats. This is not a straightforward process, however, because the number of significant bits for a floating point format is not the same as the number of significant bits for a corresponding integer format. For instance, an integer format that includes 32 significant bits converts to a floating point format with a 23-bit mantissa.

In some processors, the data path provided in the floating point arithmetic unit to process floating point numbers during processing is not adequate to perform conversions between floating point and integer formats. For example, a floating point arithmetic unit that is designed to most economically perform operations on single precision floating point numbers does not have the required data width to perform conversions. This is because the shift right or left of the floating point required by the conversion may be so large as to shift bits outside of the available data path.

SUMMARY OF THE INVENTION

A floating point arithmetic apparatus for converting numbers between an integer format and a floating point format, wherein a conversion operation requires a greater data path width than a arithmetic operation. The apparatus comprises right shift circuitry that receives a number in the floating point format, wherein the right shift circuitry includes additional register positions to accommodate a shift beyond a data path width required by an arithmetic operation.

DETAILED DESCRIPTION

An apparatus and method are described that allow conversions between an integer format and a floating point format using a floating point arithmetic unit. According to the present invention, a modified floating point arithmetic unit allows for performance of conversion operations that would not be possible in an unmodified unit. In one embodiment, the floating point arithmetic unit operates on single precision floating point numbers. A data width of an unmodified single precision floating point unit is inadequate to perform conversion operations between single precision floating point and 32-bit integer formats because a maximum possible shift left or right exceeds the unmodified data path width. In one embodiment, additional bit positions are added to operational units and data paths of the floating point arithmetic unit to accommodate the maximum possible shift required by a conversion operation. The additional bit positions enable the floating point arithmetic unit to be easily used for conversions both from floating point format to integer format and from integer format to floating point format. A circuit is provided to latch numbers coming into the floating point unit for conversion in a particular manner. A circuit is also provided to more quickly determine a number of bits to be shifted and a direction of shift in order to perform a conversion operation in fewer clock cycles.

Figure 2:
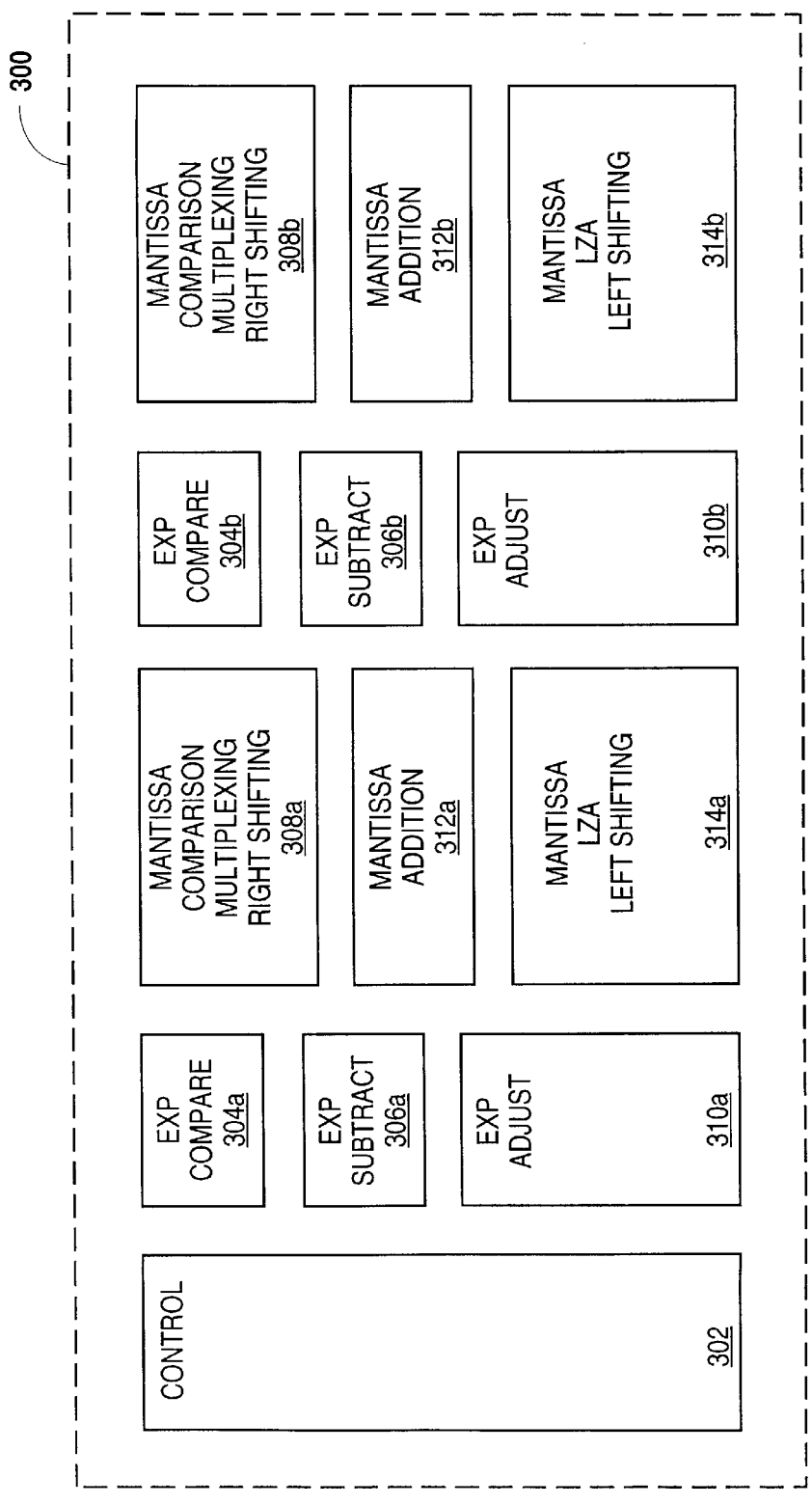
FIG. 2 is a block diagram of a floating point arithmetic and conversion unit according to one embodiment of the present invention.

FIG. 2 is a block diagram of a floating point arithmetic unit 300 according to one embodiment of the present invention. In this embodiment, floating point unit 300 performs addition and subtraction on floating point numbers in a single precision format. Floating point unit 300 includes duplicate sets of functional units to perform parallel operations on two sets of floating point operands. Duplicate, parallel functional units are designated in FIG. 2 with like numbers, for example 304a and 304b. Floating point unit 300 can therefore perform parallel operations on packed data formats, for example, as required by single instruction multiple data (SIMD) operations. Because functional units "a" are equivalent to functional units "b", only functional units "a" will be described.

Control unit 302 includes circuitry for controlling the operation of functional units within floating point unit 300. For example, control unit 302 receives instructions and determines which functional units must be used, and in which manner, to carry out an instruction. Functional unit 308a is a mantissa comparison, multiplexing, and right shifting unit. The comparison capability of unit 308a is only needed in addition and subtraction operations. Specifically, when exponents of two floating point operands are equal, it is necessary to compare mantissa portions in order to determine the smaller mantissa and arrange operands so as to avoid a negative result.

Exponent compare unit 304 compares incoming exponents in order to determine which is the larger exponent. In the case of an arithmetic operation between two floating point operands, exponent compare unit receives an exponent 1 and an exponent 2 from an operand 1 and an operand 2, respectively. In this embodiment, in the case of a conversion operation, an exponent of an incoming floating point number to be converted to an integer format is compared to a predetermined number for the purpose of determining whether a conversion operation will require a shift beyond data path space normally allotted for single precision floating point numbers in floating point unit 300. As will be explained more fully below, floating point unit 300 includes additional data path space in each of its functional units to accommodate shifts beyond a normal single precision floating point capacity. In addition, according to one embodiment, one of two conversion constants is used in a floating point to integer conversion operation. One conversion constant is used for the case in which normal single precision floating point data path capacity is adequate to perform the conversion. Another constant is used for the case in which the conversion operation will require a shift beyond the normal data path capacity required for single precision floating point numbers.

Exponent subtract unit 306a, in a conversion operation, performs a subtraction between an exponent of an incoming floating point number to be converted and a constant. As is known, constants used for conversion between a floating point format and integer format contain an exponent field that contains a predetermined number and a mantissa field that is filled with zeros. The constant takes the place of a second floating point operand in a conversion operation in floating point unit 300. The constant is a predetermined number whose value is dependent on a specific application, for example, a particular format used. Use of the constant allows the conversion to be performed in floating point unit 300. In this embodiment, the conversion constant also includes a bias. As is known in the art, processors commonly represent exponents in a biased form. This means that a constant value is added to an actual exponent so that the biased exponent is always a positive number. The value of a bias depends on the number of bits available for representing exponents in the floating point format being used. The bias and constant are chosen so that the smallest normalized number can be reciprocated without overflow.

For example, in a common external format, $-126_{10}$ is the maximum negative value representable. In this case, a bias of $+127_{10}$ is added to the exponent. Commonly, in processor internal formats the actual bias is larger because the exponent field is larger than that of an external representation.

Still referring to FIG. 2, exponent subtract unit 306a is used to subtract an exponent of an incoming floating point number from a constant (where the constant includes a constant plus a constant bias) in order to determine how many positions to the right the floating point must be shifted in order to right align the number for integer format.

Mantissa addition unit 312a is used for adding floating point numbers in an addition operation. Mantissa unit 312a can also be used in a conversion operation for complementing a negative number. As is known, floating point numbers are always represented by positive fractions in the mantissa with a sign bit indicating the sign of the number. Incoming negative integer numbers may need to be converted to positive numbers for floating point representation.

Mantissa leading zero anticipation (LZA)/left shifting unit 314a is used for left shifting in the case of a conversion from integer to floating point. Unit 314a is also used to anticipate leading 0s. When a left shift has been performed in a conversion from integer to floating point, leading zero anticipation circuitry of unit 314a determines the number of zeros to the left of a leftmost 1 if a resultant floating point number is not normalized. The number of leading zeros is transmitted to exponent adjust unit 310a. Exponent adjust unit 310a receives the number of leading zeros and shifts the number as necessary to normalize the floating point number.

Figure 3A:
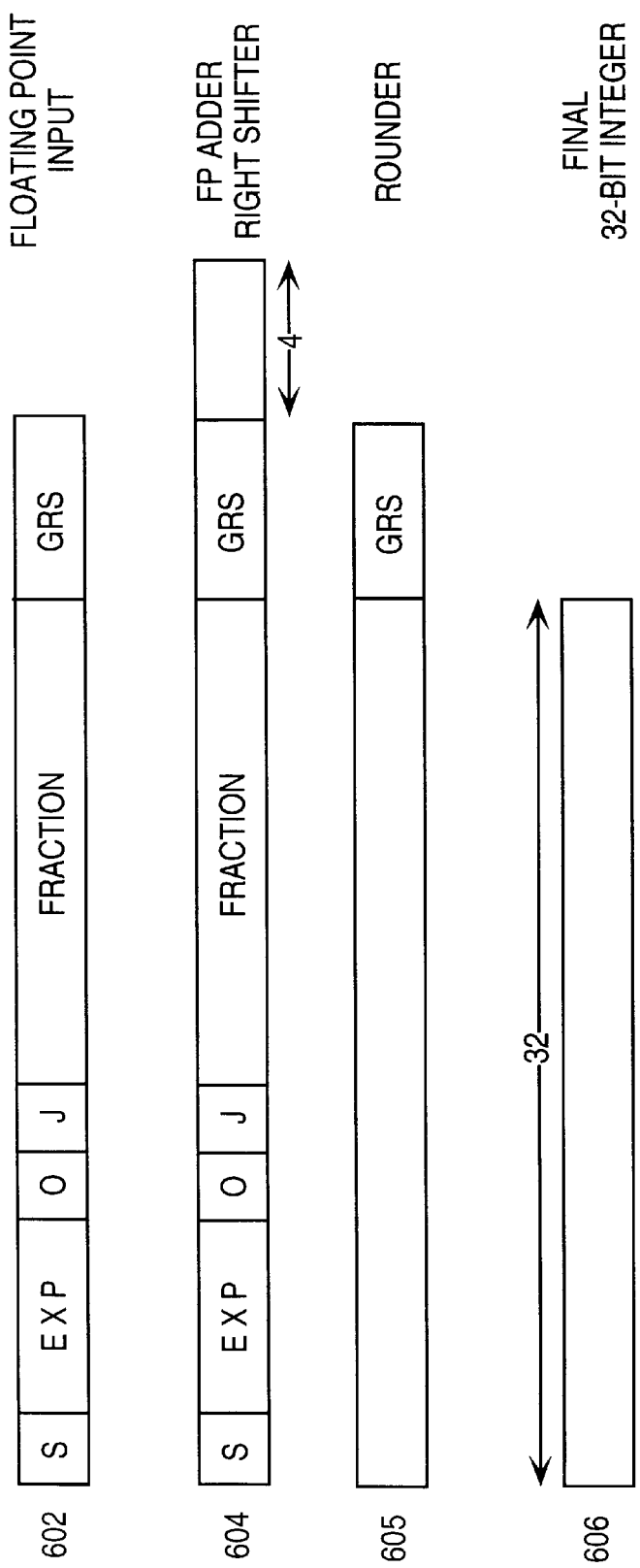
FIG. 3a is a diagram of a floating point format to integer format conversion operation when the floating point exponent is less than 23, according to one embodiment.

FIG. 3a is a diagram illustrating an operation to convert a floating point number having an exponent that is smaller than a certain number to an integer number according to one embodiment. In this embodiment, floating pint unit 300 is designed to operate on single precision floating point numbers with 23-bit mantissas. Therefore, in this embodiment, the certain number is 23. If an exponent of an incoming floating point number to be converted has an exponent that is greater than or equal to 23, it is possible that conversion will require a shift right beyond the normal data path width of a floating point unit designed to perform floating point arithmetic.

Floating point number 602 is a number to be converted that is latched into right shifter 604 of floating point unit 300 as shown. Floating point number 602 is a number in an internal floating point format according to one embodiment. The internal format of floating point number 602 is a format on which floating point unit 300 operates, and differs from an external format that is output from or input to a processor including floating point unit 300. Several external formats are known. Commonly external format conform to an Institute of Electronics and Electrical Engineers (IEEE) specification. The present invention can be used with different external and internal formats.

In the internal format of floating point number 602 the leftmost field contains a sign bit indicating whether number 602 is positive or negative. Number 602 also includes an exponent field that, in this embodiment, includes 10 bits that indicate a power to which the mantissa portion of number 602 is to be raised. In this embodiment, the mantissa portion includes the "J"bit and the fraction field. The J bit is a one-bit binary integer immediately to the left of an implied decimal point (or floating point) as shown, for example, in FIG. 1, item 106. In other embodiments, the one-bit binary integer is implied and not explicitly shown as it is in this embodiment. The fraction field contains a binary fraction of 27 bits. The "O" bit is a single bit that indicates whether a mantissa overflow exists in the number represented. In binary floating point formats such as the one shown, some numbers cannot be represented with just the exponent field, the J bit, and the fraction field. For example, in a floating point operation adding the numbers 1 and 1.5, the resultant number 2.5 requires that the O bit and the J bit contain a 1 and a 0, respectively. Numbers that have an overflow condition are not in the "normalized" floating point format. Normalized floating point format includes a value of zero in the O bit, a value of 1 in the J bit, and a binary value in the fraction field that indicates a power of two to which the number must be raised.

The "GRS" field includes 3 bits that are used for rounding control as is known in the art. The GRS bits are the guard, round, and sticky bits. The value stored in the GRS bits is used by a rounding circuit in floating point arithmetic operations to round a resultant number according to some predetermined method.

In this embodiment, additional storage capacity is present in right shifter 604 to accommodate a maximum possible number of bit position shifts. Specifically, in this embodiment, floating point unit 300 performs operations on single precision floating point numbers. Without additional storage capacity, floating point unit 300 could not accurately perform conversion operations on numbers that required a shift to the left or right over a certain number of bit positions.

In the case illustrated in FIG. 3a, the additional capacity of right shifter 604 of floating point unit 300 is not actually used because the exponent is less than 23 and so the maximum possible shift right is within the area shown as the GRS field. After shifting takes place in right shifter 604, the resultant number is rounded in rounder 605 using the GRS bits in the known way. The final 32-bit integer is available at the outputs of floating point unit 300, for example, in a register such as register 606.

Figure 3B:
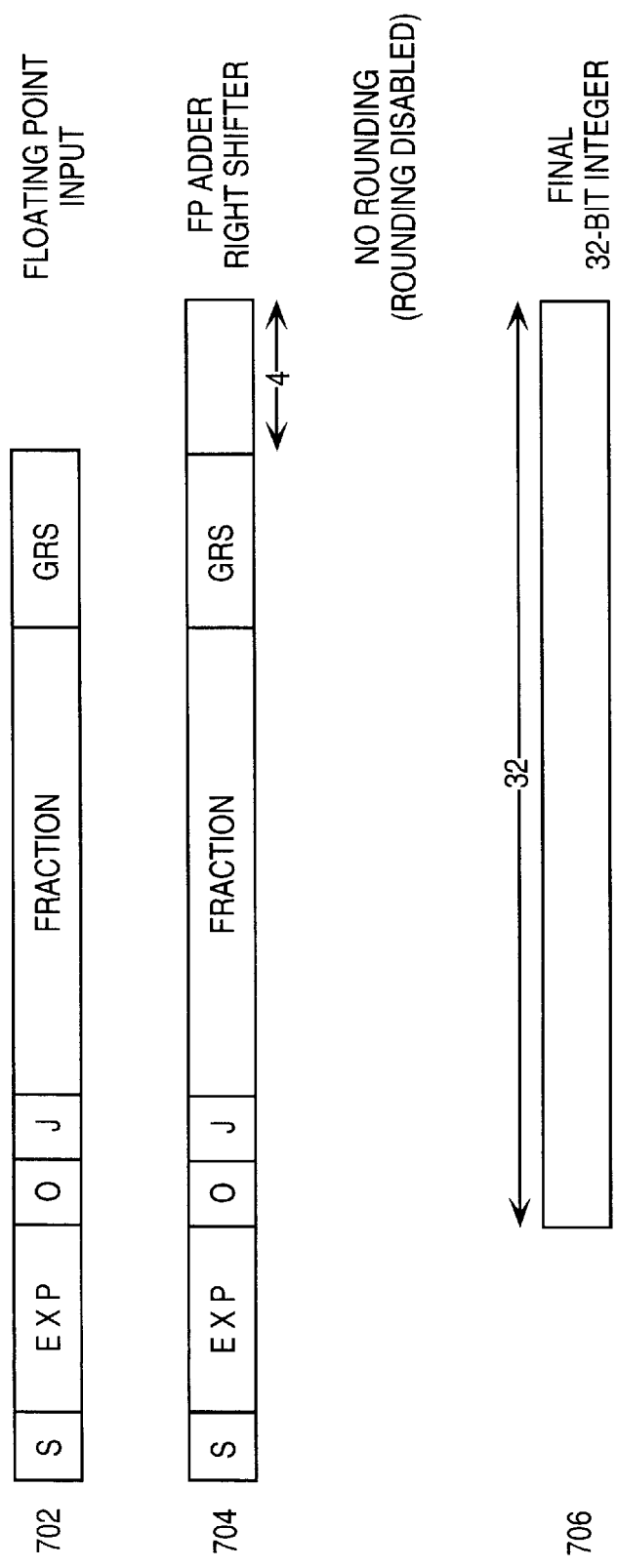
FIG. 3b is a diagram of a floating point format to integer format conversion operation when the floating point exponent is greater than or equal to 23, according embodiment.

FIG. 3b is a diagram illustrating an operation to convert a floating point number having an exponent that is greater smaller than a certain number to an integer number according to one embodiment. In this embodiment, incoming floating point number 702 is a single precision floating point number that, in one case, may require the floating point to be shifted 31 bit positions in order to convert floating point number 702 to an integer format. In prior floating point units that operate on single precision floating point numbers, a maximum shift of 24 bit positions is permitted in order to avoid overflowing into the GRS field. This is because the GRS field must be preserved for rounding. In this embodiment, it is determined whether an operation to be performed is an arithmetic operation or a conversion operation (as explained more fully below). If it is determined that the operation to be performed is a conversion operation that requires a shift into and beyond the GRS field, "virtual shifting" and "virtual rounding" are enabled. Virtual shifting uses a special, larger conversion constant comprised of a biased constant plus the maximum number of bit positions that can be shifted right. In this embodiment, the maximum number is the number of bit positions between the J bit and the rightmost bit of the additional four bits shown in right shifter 704. In the case of a maximum shift right, no rounding is performed. Therefore the GRS field need not be preserved. In this case, the control unit of floating point unit 300 generates a signal to disable the rounding circuitry (this may be referred to as virtual rounding). It is not necessary to perform rounding or use actual GRS bits because the initial GRS bits (before the start of a conversion operation) are known to be zero. Therefore, the bits potentially shifted beyond the rightmost bit of right shifter 704 (and "lost") are known to be zeros and do not have to be accounted for by bits in a GRS field. The result of the conversion operation is a final 32-bit integer that is available at the outputs of floating point unit 300, for example, in a register such as register 706.

Figure 4:
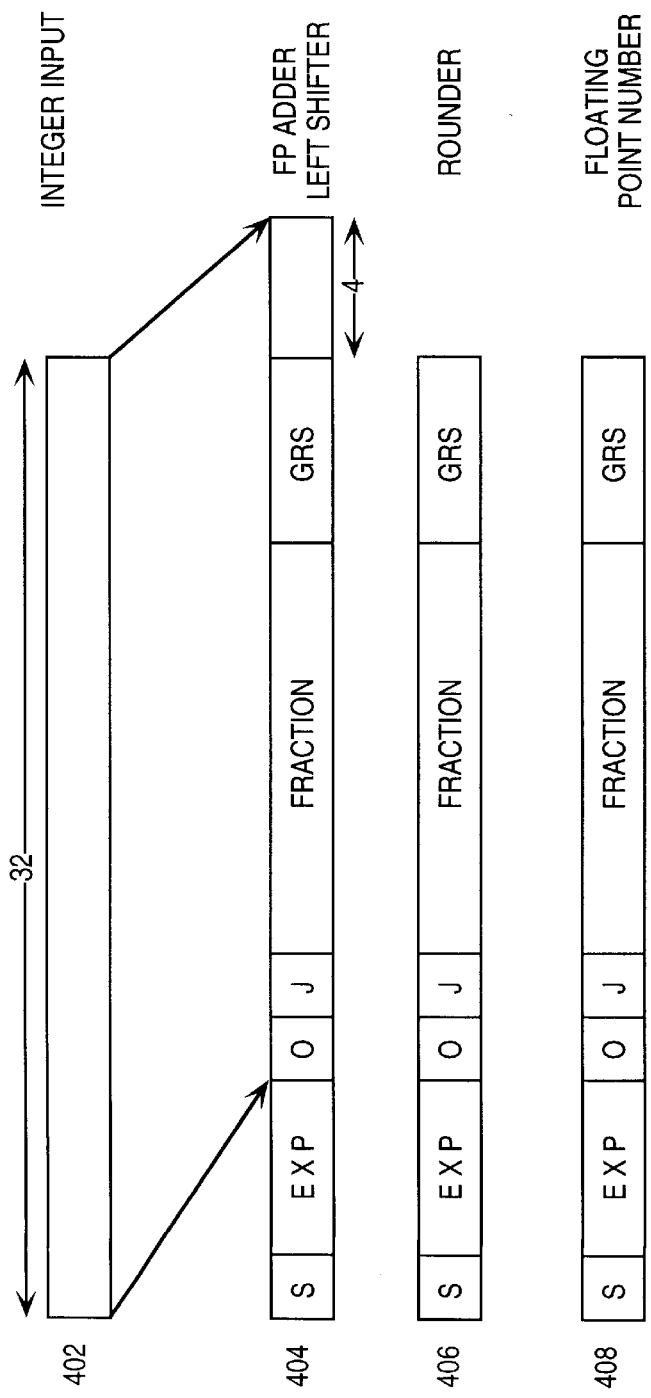
FIG. 4 is a diagram of an integer format to floating point format conversion operation according to one embodiment.

FIG. 4 is an illustration of a conversion from 32-bit integer format to single precision floating point format according to one embodiment of the present invention using floating point unit 300. Integer number 402 is a number in 32-bit integer format coming into an input of floating point unit 300. Floating point adder left shifter 404 is part of mantissa/left zero anticipation/left shifting unit 314a. Left shifter 404 includes additional bit positions to the right of the GRS field. In this embodiment, four additional bit positions are provided to accommodate a maximum shift to the left of 31 bits. The additional bit positions prevent a possible shift of significant bits into the exponent field of the resultant floating point number, which would cause a meaningless number to be created. According to this embodiment, floating point unit 300 determines how to latch an incoming number by determining the state of the incoming signal that indicates a type of instruction received. In the case of an instruction to convert a number from integer format to floating point format, floating point unit 300 latches incoming number 402 so as to align the rightmost bit of number 402 with the rightmost bit of the additional bit added to the right of the GRS field in left shifter 404. After shifting is performed by left shifter 404, the result is transferred to rounder 406. In this embodiment, rounder 406 is a separate unit from floating point unit 300. In other embodiments, rounder 406 could be in a same unit as left shifter 404. Resultant floating point number 408 is output from rounder 406. FIG. 4 does not show every intermediate operation that may be required in a conversion from integer format to floating point format. For example, mantissa addition unit 312a may be required to convert a negative integer number from its 2's compliment representation to absolute value and sign representation required for floating point. These additional intermediate operations are not pertinent to the invention.

Figures 1, 5:
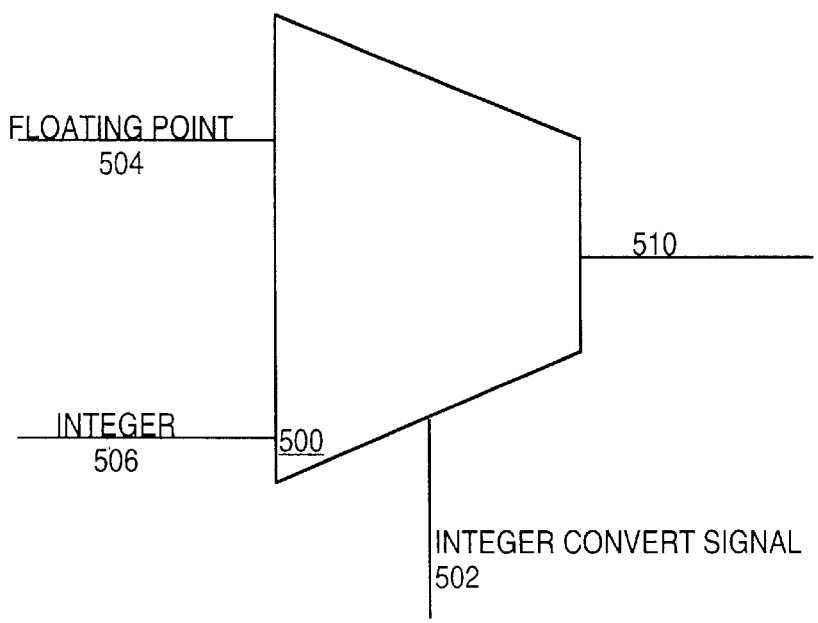
FIG. 1 shows differences between a floating point format and an integer format.
FIG. 5 is a diagram of a selection circuit according to one embodiment.

FIG. 5 is a diagram of a selection circuit used to direct floating point unit 300 to latch an incoming number in a particular way. In this embodiment, the selection circuit of FIG. 5 includes a multiplexor 500 controlled by integer convert signal 502. If an instruction received by floating point unit 300 is an integer convert instruction, integer number 506 is selected to be latched in the manner shown in FIG. 4. In this case, latch integer signal 506 is output on output 510 of multiplexor 500. In the case where a floating point to integer conversion is required by an instruction or the case where a floating point arithmetic operation is to be performed, integer convert signal 502 is not active and latch floating point signal 504 is output.

This embodiment includes the advantage of gracefully handling the case of the maximum negative integer number as input to a conversion operation. In this embodiment, the maximum negative integer comes into floating point arithmetic unit 300 with a "1" in the O bit of left shifter 404 and a zero in the J bit of left shifter 404. The maximum negative integer does not change when complimented. Therefore, when the number arrives at rounder 406, it appears as if an overflow condition exists. Rounder 406 will therefore shift the number right and adjust the floating point exponent accordingly so that a correct floating point representation is produced.

Figure 6:
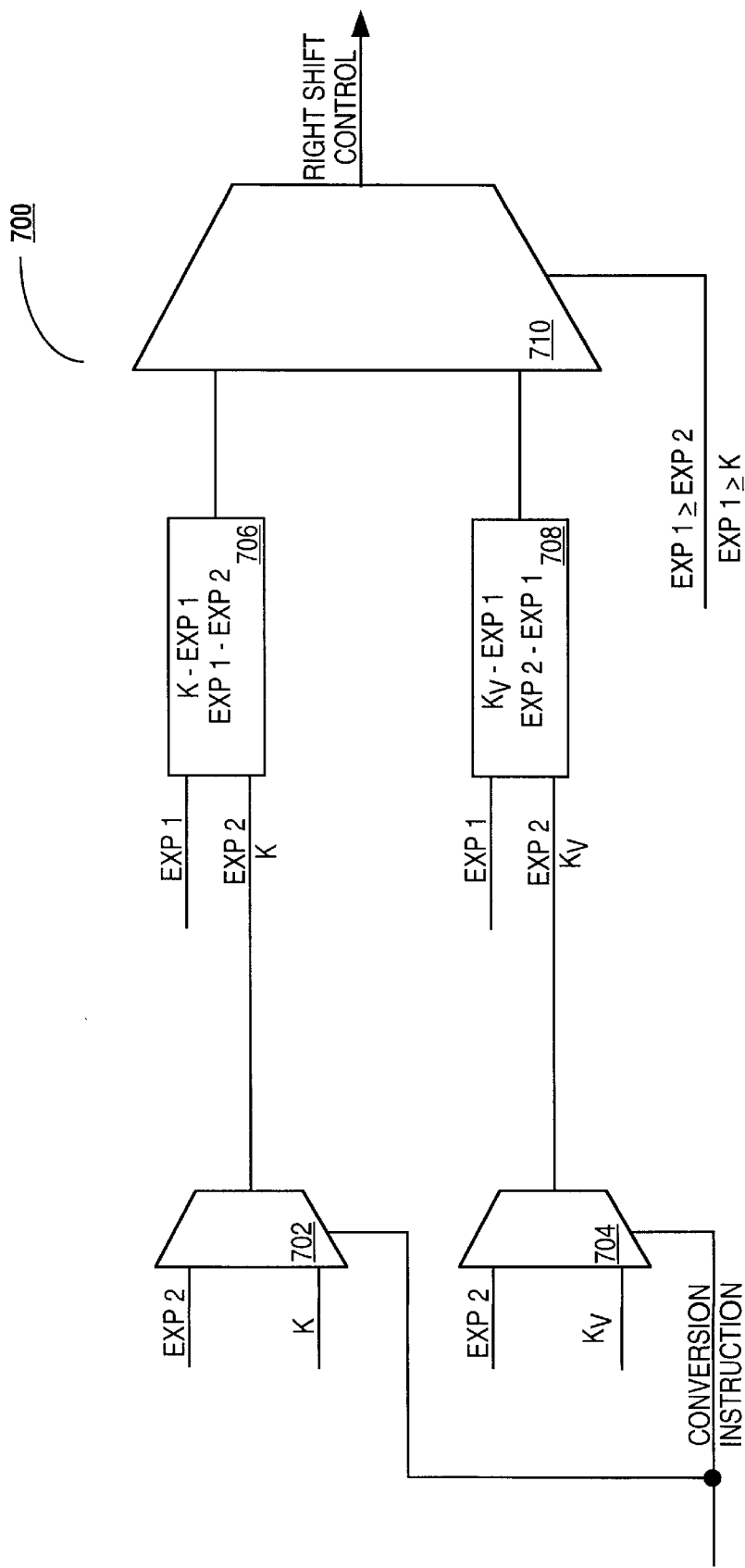
FIG. 6 is a block diagram of a selection circuit according to one embodiment.

FIG. 6 is a block diagram of a selection circuit that determines whether an incoming floating point number to be converted will require a shift of more than 23 bit positions (in this embodiment using single precision floating point numbers) and enables virtual shifting accordingly. The selection circuit of FIG. 6 speeds execution of a conversion operation by simultaneously calculating both of two possible numbers of bit positions to be shifted. In this way, a data dependency is removed. Specifically, it is not necessary to wait for the result of a subtraction operation performed on two incoming operand exponents, determine whether the result is negative or positive, and then compliment as necessary to obtain a correct shift value.

The selection circuit of FIG. 6 is also used in addition operations. As is known, floating point addition operations typically align the exponents of the two operands by shifting the number having the larger exponent to match the smaller exponent before addition takes place. In the case of addition as well as that of conversion it is necessary to determine a correct number of bits to shift by performing a subtraction operation.

Multiplexor 702 has inputs labeled exponent 2 and K. Exponent 2 represents an exponent of an arithmetic operand when an operation to be performed is an arithmetic operation. K represents a conversion constant comprised of a constant bias plus 23 for this embodiment. 23 for a single precision floating point number is the maximum number of bit positions that can be shifted without shifting into the GRS field. Multiplexor 704 has inputs exponent 2 and $K_v$. Exponent 2 is the same exponent 2 as is input to multiplexor 702. $K_v$ is an alternative conversion constant that allows virtual shifting into the GRS field and into bits to the right of the GRS field. In this embodiment, $K_v$ is 31 plus the constant bias. Because there is a difference of 4 between $K_v$ and K, a shift of 7 additional bit positions (virtual shifting) is allowed when $K_v$ is used. In this embodiment, use of $K_v$ allows bits to be shifted through the GRS field and the additional 4 bit positions to the right of the GRS field.

Both multiplexors 702 and 704 are controlled by a signal that indicates whether the instruction is a conversion instruction or an arithmetic instruction. If the instruction is a conversion instruction, multiplexor 702 outputs K and multiplexor 704 outputs $K_v$. Selector circuit 700 is also comprised of two subtraction circuits that perform two subtraction operations simultaneously. Subtractor 706 has exponent 1 on one input. Exponent 1 is the exponent of a second arithmetic operand when the operation is an arithmetic operation and exponent 1 is the exponent of the floating point number to be converted when the operation is a conversion operation. Depending upon the output of multiplexor 702 subtract circuit 706 performs either a subtraction of exponent 1 from K or a subtraction of exponent 2 from exponent 1.

Subtract circuit 708 has one input that receives exponent 1 where exponent 1 is the same exponent received by subtract circuit 706. Subtract circuit 708 also receives the output of multiplexor 704. Dependent upon the output of multiplexor 704, subtract circuit 708 performs a subtraction of exponent 1 from $K_v$ or a subtraction of exponent 1 from exponent 2. Multiplexor 710 receives the output of subtract circuit 706 and the output of subtract circuit 708. Multiplexor 710 is controlled by a signal that indicates, in the case of an arithmetic operation, whether exponent 1 is greater than or equal to exponent 2. In the case of a conversion operation, 710 is controlled by a signal that indicates whether exponent 1 is greater than or equal to K. In the case of a conversion operation, if exponent 1 is greater than or equal to K multiplexor 710 will output the difference of exponent 1 and $K_v$ as a right shift control. If exponent 1 is not greater than or equal to K, multiplexor 710 will output the difference of exponent 1 and K as a right shift control. In one embodiment, constant values K and $K_v$ are stored in a read only memory (ROM).

The present invention has been described in terms of specific embodiments. For example, embodiments have been described which use particular floating point or integer formats and particular bit fields and numbers of bits. The invention, however, is not limited to these specific formats. Various modifications and alterations might be made by those skilled in the art without departing from the spirit and scope of the invention as set forth in the following claims.

What is claimed is:

1. A floating point arithmetic apparatus for converting numbers between an integer format including a least significant bit position and a floating point format including an exponent portion and a fraction portion, wherein a conversion operation requires a greater data path width than a floating point arithmetic operation, said floating point arithmetic apparatus comprising:

right shift circuitry to receive a number in the floating point format, wherein the right shift circuitry includes additional register positions to the right of the rightmost position required by a floating point arithmetic operation to accommodate a right shift beyond a data path width required by a floating point arithmetic operation; and right shift control circuitry to control the right shift circuitry to produce a number in the integer format with the least significant bit position having a first alignment, in response to the exponent portion of the number received in floating point format having a first magnitude, and to produce a number with the least significant bit position having a second alignment different from the first alignment in response to the exponent portion having a second magnitude different from the first magnitude.

2. The apparatus of claim 1, further comprising a first selection circuit operable to align a number according to whether a current operation is a conversion operation or an arithmetic operation.

3. The apparatus of claim 2, further comprising left shift circuitry that receives a number in the integer format, wherein the left shift circuitry includes additional register positions to accommodate a shift beyond the data path width required by a floating point arithmetic operation.

4. The apparatus of claim 3, wherein the first selection circuit is a multiplexor that causes the apparatus to latch an incoming number so as to fill the additional register positions when the current operation is a conversion from the integer format to the floating point format.

5. The apparatus of claim 1, further comprising:

a rounding circuit that receives a converted number for rounding, and control circuitry that generates a disable signal to the rounding circuit when a conversion operation requires a shift beyond the data path width required by a floating point arithmetic operation.

6. An apparatus for converting numbers between an integer format and a floating point format including an exponent portion and a fraction portion, the apparatus comprising:

a shifter to receive a floating point number in said floating point format, wherein the shifter includes additional register positions to the right of the rightmost position required by a floating point arithmetic operation to accommodate a right shift beyond a data path width required by a floating point arithmetic operation;

a first selection circuit to align a number with respect to the additional register positions according to whether a current operation is an arithmetic operation or a conversion operation;

a second selection circuit to select either an exponent of a floating point number to be added to another floating point number or two exponent constant values based upon whether the current operation is an arithmetic operation or a conversion operation;

a subtractor to receive the two exponent constant values and to produce two difference values by subtracting an exponent of the floating point number to be converted from each of the two exponent constant values;

a third selection circuit to select one of the two difference values as an indication of a number of bit positions to shift right based upon whether the exponent of the floating point number to be converted is greater than or equal to a certain number; and a shift control unit to control the shifter to shift fraction portion data of the floating point number into the additional register positions based on which of the two difference values is selected.

7. The apparatus of claim 6, wherein the second selection circuit comprises first and second multiplexors, the first multiplexor having inputs comprising an exponent of an arithmetic operand and a first exponent constant value, the second multiplexor having inputs comprising the exponent of the arithmetic operand and a second exponent constant value, the first and second multiplexors having a control input that indicates whether an instruction being executed is an arithmetic instruction or a conversion instruction.

8. A processor comprising:

a floating point circuit to perform arithmetic of floating point numbers and conversion of numbers between a floating point format, including an exponent portion and a fraction portion, and an integer format, wherein a data path width required for a conversion operation is greater than a data path width required for an arithmetic operation, the floating point circuit comprising:

a right shift circuit to receive a floating point number to be converted, wherein the right shift circuit includes additional bit positions to the right of a rightmost bit of the floating point number to be converted, and wherein when an operation to be performed is a conversion operation, the right shift circuit latches the floating point number to be converted so that the additional bit positions are unoccupied;

a left shift circuit to receive an integer number to be converted, wherein the left shift circuit includes additional bit positions to the right of a rightmost bit of the integer number to be converted, and wherein when the operation to be performed is a conversion operation, the left shift circuit latches the integer number so that the additional bit positions are occupied; and a right shift control circuit to control the right shift circuit to output an integer number with a least significant bit position having a first alignment in response to the exponent portion of the floating point number having a first magnitude, and to output an integer number with a least significant bit position having an alignment different from the first alignment, in response to said exponent portion having a second magnitude.

9. The processor of claim 8, wherein the right shift control circuit further comprises:

a subtraction circuit to subtract an exponent of the floating point number to be converted from a first conversion constant to produce a first shift value and to subtract the exponent of the floating point number to be converted from a second conversion constant to produce a second shift value, and a select circuit coupled to the subtraction circuit to select one of the first and second shift values to transmit to the right shift circuit.

10. The processor of claim 9, wherein the floating point circuit further comprises a comparator to output a signal that indicates whether the exponent of the number to be converted is greater than or equal to a certain number, wherein the signal controls the select circuit such that if the exponent of the number to be converted is greater than or equal to the certain number, the second shift value is selected by the select circuit, the second shift value being greater than the first shift value.

11. A processor comprising a floating point unit to perform arithmetic of floating point numbers and conversion of numbers between a floating point format, including an exponent portion and a fraction portion, and an integer format, the floating point unit including:

a right shifter to receive a floating point number to be converted, wherein the right shifter includes additional bit positions to the right of a rightmost bit of the floating point number to be converted, and wherein when an operation to be performed is a conversion operation, the right shifter latches the floating point number to be converted so that the additional bit positions are unoccupied;

a left shifter to receive an integer number to be converted, wherein the left shifter includes additional bit positions to the right of a rightmost bit of the integer number to be converted, and wherein when the operation to be performed is a conversion operation, the left shifter latches the integer number so that the additional bit positions are occupied;

a first selection circuit to select either an exponent of a floating point number to be added to another floating point number or two exponent constant values based upon whether the floating point circuit is performing an arithmetic operation or a conversion operation;

a subtractor to receive the two exponent constant values and to output two difference values, wherein the subtractor separately subtracts an exponent of the floating point number to be converted from each of the two exponent constant values;

a second selection circuit to select one of the two difference values as an indication of a number of bit positions to shift right based upon whether the exponent of the floating point number to be converted is greater than or equal to a certain number; and a right shift control circuit to control the right shifter to output fraction portion bits into the additional bit positions based on which of the two difference values is selected.

12. The processor of claim 11, wherein the first selection circuit comprises two multiplexors that each chooses between a conversion constant and an exponent of an arithmetic operand.

13. A method for using a floating point arithmetic circuit to perform a conversion between a floating point format and an integer format, comprising:

receiving a floating point number in the floating point arithmetic circuit, determining whether a shift operation required to align the floating point number for integer representation will cause significant bits to be shifted beyond a bit position represented by an extreme rightmost bit of the floating point number, if it is determined that the shift operation required to align the floating point number for integer representation will cause any bits to be shifted beyond the bit position, using a second conversion constant to determine a number of bit positions to shift, else, using a first conversion constant to determine the number of bit positions to shift, wherein the second conversion constant is larger than the first conversion constant.

14. The method of claim 13, further comprising:

if the second conversion constant is used to determine the number of bit positions to shift, shifting bits of the floating point number right to fill additional bit positions outside of a rightmost rounding field of a floating point representation, and generating a disable signal to a rounding circuit that indicates that the rounding circuit is not required to perform rounding on a resultant integer number.

15. The method of claim 14, wherein the step of determining comprises comparing an exponent of the received floating point number with a predetermined constant that is derived using a maximum number of bit positions that can be shifted before bits are shifted beyond the extreme rightmost bit of the floating point number.

16. The method of claim 15, wherein the integer number is a 32-bit number, the floating point number is a single precision floating point number, and the maximum number of bit positions is 23.

* * * * *